US010616995B2

(12) United States Patent
Kim

(10) Patent No.: US 10,616,995 B2
(45) Date of Patent: Apr. 7, 2020

(54) RF CABLE CONNECTION DEVICE AND ELECTRONIC DEVICE HAVING SAME

(71) Applicant: SAMSUNG ELECTRONICS CO., LTD., Suwon-si, Gyeonggi-do (KR)

(72) Inventor: Yongyoun Kim, Anyang-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/066,115

(22) PCT Filed: Oct. 14, 2016

(86) PCT No.: PCT/KR2016/011529

§ 371 (c)(1),
(2) Date: Jun. 26, 2018

(87) PCT Pub. No.: WO2017/122907

PCT Pub. Date: Jul. 20, 2017

(65) Prior Publication Data

US 2019/0014656 A1 Jan. 10, 2019

(30) Foreign Application Priority Data

Jan. 12, 2016 (KR) ........................ 10-2016-0003560

(51) Int. Cl.
*H05K 1/02* (2006.01)
*H01R 13/6471* (2011.01)
(Continued)

(52) U.S. Cl.
CPC ........... *H05K 1/0243* (2013.01); *H01Q 1/245* (2013.01); *H01Q 1/38* (2013.01); *H01R 12/00* (2013.01);
(Continued)

(58) Field of Classification Search
CPC .... H05K 1/0243; H05K 9/006; H05K 9/0032; H05K 1/028; H05K 9/0024;
(Continued)

(56) References Cited

U.S. PATENT DOCUMENTS

2005/0017910 A1 1/2005 Park
2006/0293091 A1* 12/2006 Hawker ................. H04M 1/03 455/575.1

(Continued)

FOREIGN PATENT DOCUMENTS

JP 2005-045810 2/2005
KR 10-2008-0017857 2/2008

(Continued)

OTHER PUBLICATIONS

International Search Report for PCT/KR2016/011529 dated Feb. 10, 2017, 4 pages.

(Continued)

*Primary Examiner* — Brandon J Miller
(74) *Attorney, Agent, or Firm* — Nixon & Vanderhye, P.C.

(57) ABSTRACT

An RF cable connection device and an electronic device having the same are provided. The electronic device comprises: a housing; a printed circuit board located in the housing and including a first surface facing a first direction, a second surface facing a second direction opposite the first direction, and a third surface facing at least one direction other than those of the first and second surfaces; a first conductive contact located on the first surface of the printed circuit board; a second conductive contact located on the first surface of the printed circuit board; and at least one electrically conductive line, wherein the electrically conductive line comprises a first end part electrically connected to the first conductive contact, a second end part electrically
(Continued)

40
20
52
50
54
45 connected to the second conductive contact, and at least one insulation member for electrically insulating a part of the at least one electrically conductive line, and the at least one electrically conductive line and the at least one insulation member can comprise a first part extending on at least one lateral surface of the printed circuit board. Other examples are possible.

5 Claims, 12 Drawing Sheets

(51) Int. Cl.

| | |
|---|---|
| ***H01R 12/00*** | (2006.01) |
| ***H01R 12/50*** | (2011.01) |
| ***H05K 9/00*** | (2006.01) |
| ***H01Q 1/24*** | (2006.01) |
| ***H01Q 1/38*** | (2006.01) |
| ***H01R 12/62*** | (2011.01) |
| ***H04M 1/02*** | (2006.01) |
| ***H01R 4/04*** | (2006.01) |
| ***H05K 1/14*** | (2006.01) |

(52) U.S. Cl.

CPC ............. *H01R 12/50* (2013.01); *H01R 12/62* (2013.01); *H01R 13/6471* (2013.01); *H04M 1/0274* (2013.01); *H04M 1/0277* (2013.01); *H05K 1/028* (2013.01); *H05K 9/006* (2013.01); *H05K 9/0024* (2013.01); *H05K 9/0032* (2013.01); *H01R 4/04* (2013.01); *H05K 1/0216* (2013.01); *H05K 1/147* (2013.01); *H05K 2201/09027* (2013.01); *H05K 2201/10098* (2013.01); *H05K 2201/10356* (2013.01); *H05K 2201/10371* (2013.01)

(58) Field of Classification Search

CPC ....... H05K 1/0216; H05K 2201/09027; H05K 2201/10371; H05K 1/147; H05K 2201/10098; H05K 2201/10356; H01Q 1/38; H01Q 1/245; H01R 12/62; H01R 12/50; H01R 13/6471; H01R 12/00; H01R 4/04; H04M 1/0277; H04M 1/0274

See application file for complete search history.

(56) References Cited

U.S. PATENT DOCUMENTS

| | | | | |
|---|---|---|---|---|
| 2009/0086450 | A1* | 4/2009 | Matsui ................. | H05K 3/4691 361/761 |
| 2009/0122847 | A1* | 5/2009 | Nysen ...................... | H01Q 1/38 375/222 |
| 2010/0273539 | A1 | 10/2010 | Lee et al. | |
| 2011/0003622 | A1* | 1/2011 | Hwang ................ | H05K 1/0215 455/575.1 |
| 2011/0133998 | A1 | 6/2011 | Hobson et al. | |
| 2012/0064843 | A1* | 3/2012 | Kim ...................... | H01Q 1/243 455/83 |
| 2014/0078008 | A1 | 3/2014 | Kang et al. | |
| 2014/0225806 | A1 | 8/2014 | Lee et al. | |
| 2014/0274231 | A1* | 9/2014 | De Luis ................ | H01Q 5/321 455/575.7 |
| 2015/0036271 | A1 | 2/2015 | Park et al. | |

FOREIGN PATENT DOCUMENTS

| | | |
|---|---|---|
| KR | 10-2010-0116321 | 11/2010 |
| KR | 10-2011-0003629 | 1/2011 |
| KR | 10-1305518 | 9/2013 |
| KR | 10-2014-0037687 | 3/2014 |
| KR | 10-2015-0015116 | 2/2015 |

OTHER PUBLICATIONS

Written Opinion of the ISA for PCT/KR2016/011529, dated Feb. 10, 2017, 5 pages.

* cited by examiner

RF CABLE CONNECTION DEVICE AND ELECTRONIC DEVICE HAVING SAME

This application is the U.S. national phase of International Application No. PCT/KR2016/011529, filed 14 Oct. 2016, which designated the U.S. and claims priority to KR Patent Application No. 10-2016-0003560 filed 12 Jan. 2016, the entire contents of each of which are hereby incorporated by reference.

TECHNICAL FIELD

Various embodiments of the present invention relate to a radio frequency (RF) cable connecting device.

BACKGROUND ART

In next generation high frequency communication technology, there is of upper and lower antenna switching technology that determines whether to use an upper antenna and a lower antenna according to a condition. For example, when the lower antenna is held by a hand, by performing communication using the upper antenna, a communication performance is enhanced.

In order to implement upper and lower antenna switching technology, a structure that connects two antennas in a single high frequency modem chip is required, and for such a connection, a microstrip may be used in a coaxial cable or a printed circuit board (PCB) or a high frequency signal may be transmitted through a transmission line formed within a flexible printed circuit board (FPCB).

In most cases, due to a specific absorption rate (SAR), interest has increased in a lower antenna of a terminal. That is, when using a micro strip in a PCB, a small loss occurs, but because it is very difficult to actually implement a long wiring in a straight line, by disposing a high frequency modem chip at the lower end of a terminal, a distance to the lower antenna may be minimized and the upper antenna may be connected in a straight line using the coaxial cable.

However, in order to connect thin and long using a coaxial cable, the ground should be connected to each intermediate portion of a connecting portion. Otherwise, because a loss of a cable is large, it is difficult to substantially implement the connection.

Accordingly, as an implementation method, there is a method of using a structure that fixes a coaxial cable with a shield can. According to such a fixing structure method, by using a fixing structure as the ground as well as fixing of a coaxial cable, an area or availability may be increased.

As another method, there is a method of using a particular FPCB type wire that can use a high frequency wiring. However, in this method, because only parts of a low height cannot help being disposed at a space through which an FPCB passes, this method may be inefficient.

As another general method, there is a method of a structure that fixes using clips at each intermediate portion in which a coaxial cable is used. However, in this method, because parts cannot help being disposed at a space through which a coaxial cable passes, this method may be a most inefficient structure in component disposition on a PCB.

Therefore, various embodiments of the present invention provide an RF cable connecting device and an electronic device having the same that can connect a high frequency cable to an upper antenna and that can reduce a mounting space.

In accordance with an aspect of the present invention, an electronic device having an RF cable connecting device includes a housing; a printed circuit board (PCB) located at the housing and including a first surface facing in a first direction, a second surface facing in a second direction opposite to the first direction, and a third surface facing in at least one direction different from that of the first and second surfaces; a first conductive contact point located at the first surface of the PCB; a second conductive contact point located at the first surface of the PCB; and at least one electrically conductive line, wherein the electrically conductive line includes a first end portion electrically connected to the first conductive contact point, a second end portion electrically connected to the second conductive contact point, and at least one insulating member configured to electrically insulate a portion of the at least one electrically conductive line, and wherein the at least one electrically conductive line and the at least one insulating member include a first portion extended to at least one side surface of the PCB.

The at least one electrically conductive line and the at least one insulating member may include a second portion bent from the first portion adjacent to the first end portion connected to the first conductive contact point.

The at least one electrically conductive line and the at least one insulating member may include a third portion bent from the first portion adjacent to the second end portion connected to the second conductive contact point.

The PCB may include a plurality of layers including at least one conductive layer, and one of the at least one electrically conductive line may be electrically connected to the at least one conductive layer through a side surface of the PCB.

The at least one electrically conductive line and the at least one insulating member may be connected together from a coaxial cable and/or a flexible PCB.

In accordance with another aspect of the present invention, a radio frequency (RF) cable connection device includes an RF cable using a flexible printed circuit board (FPCB) including receptacles; and a printed circuit board (PCB) to which the RF cable is vertically stood and attached.

The receptacle of one end of the RF cable may be connected to an RF modem, and the receptacle of the other end of the RF cable may be connected to an antenna.

The receptacle may be located at one surface of the PCB.

One of the receptacles may be located at one surface of the PCB, and the other one of the receptacles may be located at the other surface of the PCB.

The RF cable may include a plurality of grounds spaced at a predetermined interval for bonding to a peripheral ground.

The ground may be a conductive adhesive tape attached to the RF cable in a serrate shape and be connected to the PCB.

The conductive adhesive tape may be connected to a side surface of the PCB.

The ground may be connected to a side surface of a shield can.

In accordance with another aspect of the present invention, an electronic device having an RF cable connecting device includes a printed circuit board (PCB) configured to mount a shield can configured to cover a radio frequency (RF) modem, an antenna, and a lens module, and at least some of electronic components for the lens module; and an RF cable stood and assembled at the PCB to connect the RF modem and the antenna.

The RF cable may include a receptacle connected to the RF modem and a receptacle connected to the antenna.

The receptacle may be located at one surface of the PCB.

One of the receptacles may be located at one surface of the PCB, and the other one of the receptacles may be located at the other surface of the PCB.

The RF cable may include a plurality of grounds spaced at a predetermined interval for bonding to a peripheral ground.

According to various embodiments of the present invention, because an RF cable is disposed at a side surface of a PCB with vertically stood, the RF cable does not occupy much mounting space and can connect an upper antenna and an RF modem.

Further, according to various embodiments of the present invention, by selecting a direction of a receptacle according to a position of an RF connector located at a PCB, an RF cable connection device can connect to an opposite surface by a connection of one time.

DETAILED DESCRIPTION OF EXAMPLE EMBODIMENTS

Figure 1:
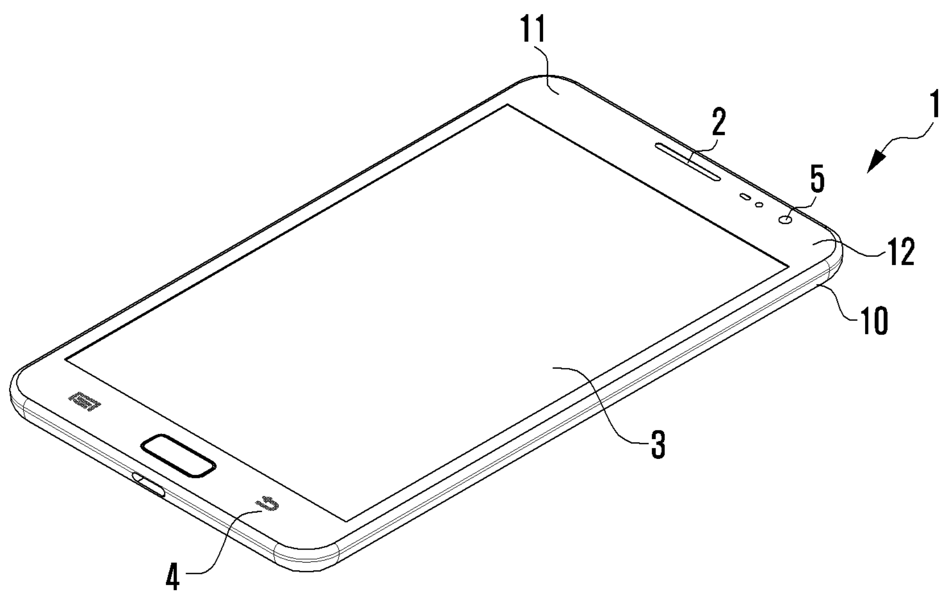
FIG. 1 is a front perspective view illustrating a mobile terminal illustrated as an electronic device having a RF cable connection device according to various embodiments of the present invention.

Hereinafter, various embodiments of this document will be described with reference to the accompanying drawings. However, it should be understood that technology described in this document is not limited to a specific embodiment and includes various modifications, equivalents, and/or alternatives of an embodiment of this document. The same reference numbers are used throughout the drawings to refer to the same or like parts.

In this document, an expression such as "have," "may have," "comprise," or "may comprise" indicates existence of a corresponding characteristic (e.g., constituent element such as a numerical value, function, operation, or component) and does not exclude the presence of another characteristic.

In this document, an expression such as "A or B", "at least one of A or/and B", or "one or more of A or/and B" may include all possible combinations of together listed items. For example, "A or B," "at least one of A and B," or "one or more of A or B" may indicate all of (1) a case of including at least one A, (2) a case of including at least one B, and (3) a case of including both at least one A and at least one B.

An expression such as "first" and "second" used in this document may indicate various constituent elements regardless of order and/or importance, is used for distinguishing a constituent element from another constituent element, and does not limit corresponding constituent elements. For example, a first user device and a second user device may represent another user device regardless of order and/or importance. For example, a first constituent element may be referred to as a second constituent element without deviating from the scope described in this document, and similarly, a second constituent element may be referred to as a first constituent element.

When it is described that a constituent element (e.g., a first constituent element) is "(operatively or communicatively) coupled with/to" or is "connected to" another constituent element (e.g., a second constituent element), it should be understood that the constituent element may be directly connected to the another constituent element or may be connected to the another constituent element through another constituent element (e.g., a third constituent element). However, when it is described that a constituent element (e.g., a first constituent element) is "directly connected" or is "directly accessed" to another constituent element (e.g., a second constituent element), it may be understood that another constituent element (e.g., a third constituent element) does not exist between the constituent element and the other constituent element.

An expression "configured to" used in this document may be interchangeably used with, for example, "suitable for", "having the capacity to", "designed to", "adapted to", "made to", or "capable of" according to a situation. A term "configured to" does not always mean "specifically designed to" in hardware. Alternatively, in any situation, an expression "device configured to" may mean that the device is "capable of" being configured together with another device or component. For example, a "processor configured to perform phrases A, B, and C" may be a generic-purpose processor (e.g., CPU or application processor) that executes an exclusive processor (e.g., an embedded processor) for performing a corresponding operation or at least one software program stored at a memory device to perform a corresponding operation.

Terms used in this document are used for describing a specific embodiment and do not limit a range of another embodiment. Unless the context otherwise clearly indicates, words used in the singular include the plural, and the plural includes the singular. Terms used here including a technical or scientific term have the same meaning as that which may be generally understood by a person of common skill in the art. Terms defined in a general dictionary among terms used in this document may be analyzed as the same meaning as or a meaning similar to that in a context of related technology, and unless it is clearly defined in this document, the term is not analyzed as having an ideal or excessively formal meaning. In some cases, a term defined in this document cannot be analyzed to exclude the embodiments of this document.

An electronic device according to various exemplary embodiments of the present invention may be a device including a communication function. For example, the electronic device may include at least one of a smart phone, tablet personal computer (PC), mobile phone, video phone, e-book reader, desktop PC, laptop PC, netbook computer, personal digital assistant (PDA), portable multimedia player (PMP), MPEG 3 (MP3) player, mobile medical equipment, camera, wearable device (e.g., head-mounted-device (HMD) such as electronic glasses), electronic clothing, electronic bracelet, electronic necklace, electronic accessory, electronic tattoo, and smart watch.

In any embodiment, the electronic device may be a smart home appliance. The smart home appliance may include at least one of, for example, a television, digital video disk (DVD) player, audio device, refrigerator, air-conditioner, cleaner, oven, microwave oven, washing machine, air cleaner, set-top box, home automation control panel, security control panel, television box (e.g., Samsung HomeSync™, AppleTV™, or Google TV™), game console (e.g., Xbox™, PlayStation™), electronic dictionary, electronic key, camcorder, and electronic frame.

In another embodiment, an electronic device may include at least one of various medical devices (e.g., various portable medical measurement devices (blood sugar measurement device, heartbeat measurement device, blood pressure measurement device, or body temperature measurement device), magnetic resonance angiography (MRA) device, magnetic resonance imaging (MRI) device, computed tomography (CT) device, scanning machine, and ultrasonic wave device), navigation device, global positioning system (GPS) receiver, event data recorder (EDR), flight data recorder (FDR), vehicle infotainment device, ship electronic equipment (e.g., ship navigation device, gyro compass), avionics, security device, vehicle head unit, industrial or home robot, automatic teller's machine (ATM) of a financial institution, point of sales (POS) of a store, and Internet of things (e.g., bulb, various sensors, electricity or gas meter, sprinkler, fire alarm, thermostat, street light, toaster, exercise mechanism, hot water tank, heater, boiler).

According to any embodiment, the electronic device may include at least one of a portion of furniture or a building/structure, electronic board, electronic signature receiving device, projector, and various measurement devices (e.g., water supply, electricity, gas, or electric wave measurement device).

In various embodiments, the electronic device may be a combination of one or more of the foregoing various devices. An electronic device according to any embodiment may be a flexible electronic device. Further, the electronic device according to an embodiment of this document is not limited to the foregoing devices and may include a new electronic device according to technology development.

An electronic device including an RF cable connection device according to various embodiments of the present invention may be provided with a short range communication module for short range communication. As short range communication technology, Bluetooth, radio frequency identification (RFID), infrared data association (IrDA), ultra wideband (UWB), ZigBee, and near field communication (NFC) may be used.

Figure 2:
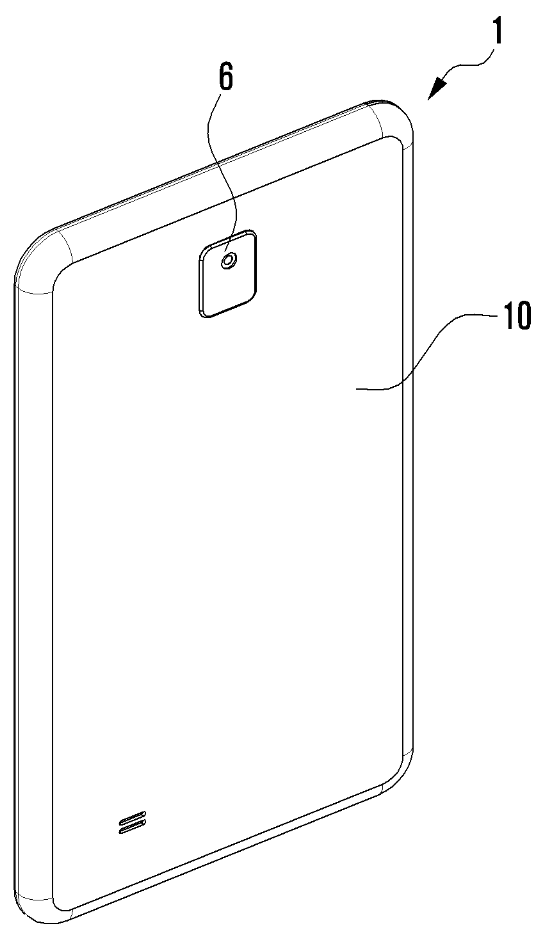
FIG. 2 is a rear perspective view illustrating the mobile terminal of FIG. 1.

FIGS. 1 and 2 illustrate a front surface and a rear surface, respectively, of a mobile terminal 1 illustrated as an electronic device having a RF cable connecting device according to various embodiments of the present invention.

With reference to FIGS. 1 and 2, the mobile terminal 1 includes a speaker 2 for outputting a sound, a touch screen 3 for displaying an image and receiving a touch input, a keypad 4 in which a menu button, a home button, and a cancel button are disposed, and a front camera 5 or a rear camera 6.

Further, the mobile terminal 1 has a housing that forms an external shape, and each component is received at a receiving space of the housing.

The housing may include a front housing 12, a rear housing (not shown), and a rear cover (or battery cover) 10.

The front housing 12 and the rear housing are coupled, the battery cover 10 covers the rear housing, the front housing 12 is disposed at a front surface of the mobile terminal 1, and the battery cover 10 is disposed at a rear surface thereof.

The rear camera 6 may include an optical image stabilizer (OIS) applied camera module.

Figure 3:
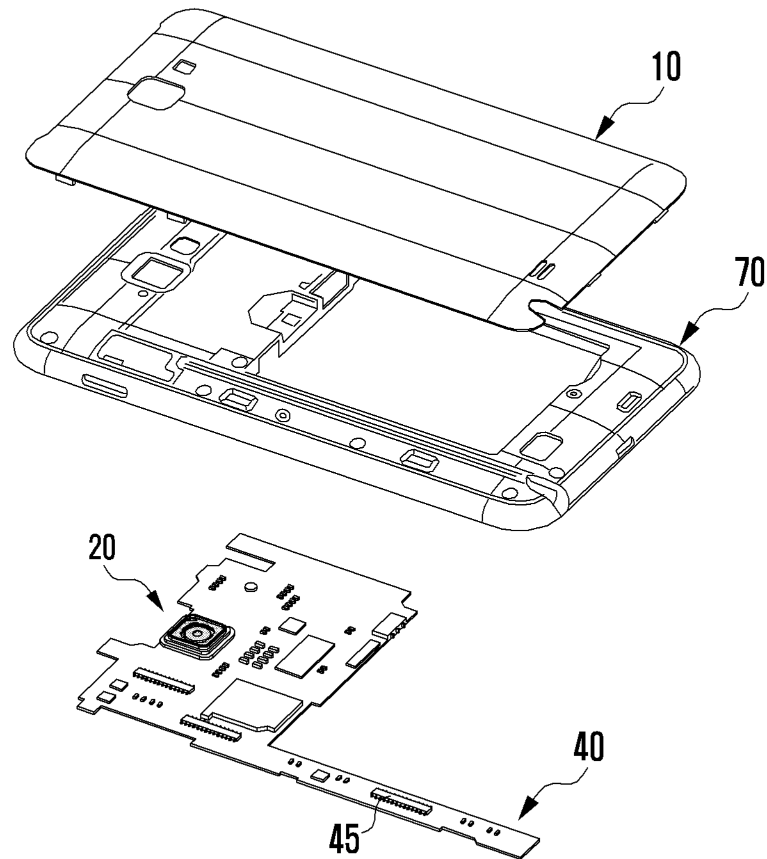
FIG. 3 is an exploded perspective view illustrating the mobile terminal of FIG. 1.
Figure 3:
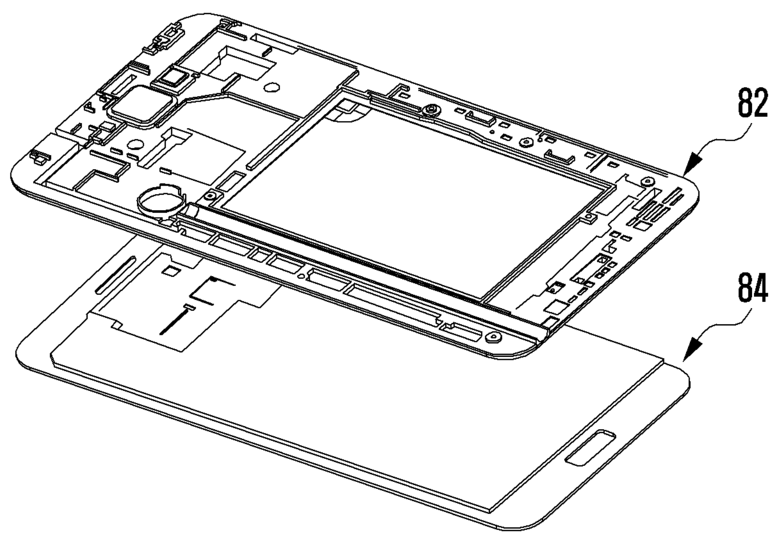
Figure 4:
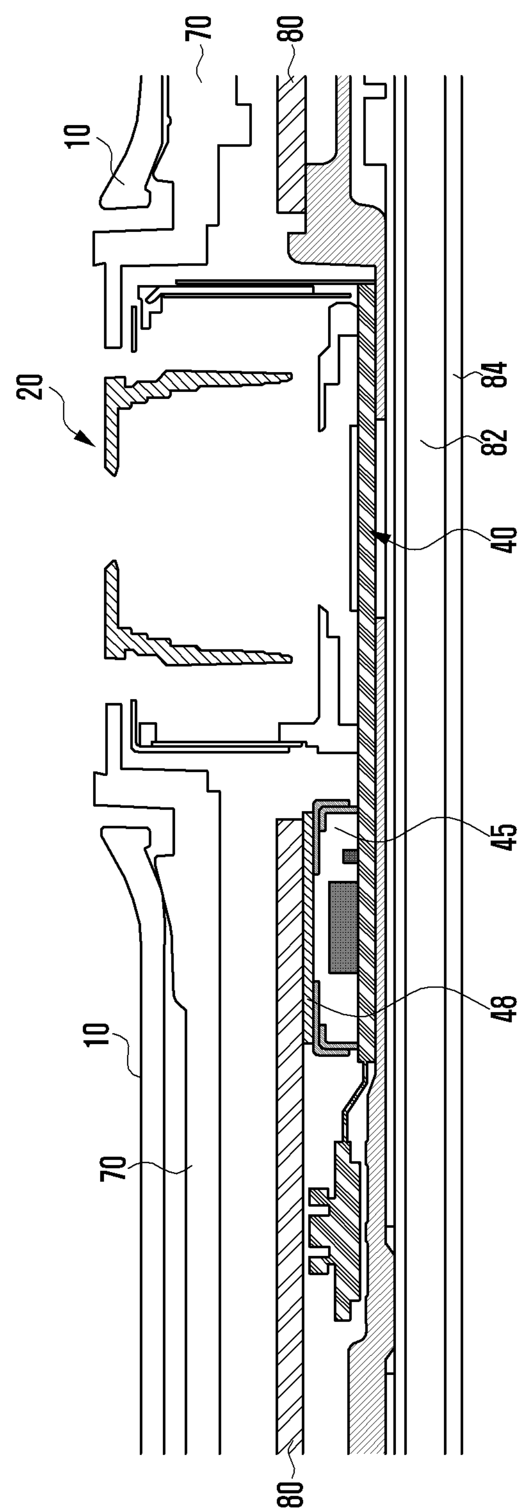
FIG. 4 is a partial coupled cross-sectional view illustrating the mobile terminal of FIG. 3.

FIG. 3 illustrates a mobile terminal as an electronic device having a RF cable connecting device according to various embodiments of the present invention, and FIG. 4 is a partial coupled cross-sectional view illustrating the mobile terminal of FIG. 3.

With reference to FIGS. 3 and 4, a mobile terminal of an electronic device having a RF cable connection device according to various embodiments of the present invention may include a battery cover 10, rear case 70, main circuit board 80, printed circuit board (PCB) 40 in which a lens module is mounted, display bracket 82, and display 84.

The PCB 40 is a rigid circuit board, and in the PCB 40, a lens module 20 of an OIS functional component is mounted, and a plurality of shield cans 45 that cover at least some of electronic components for the lens module 20 may be disposed at upper and lower portions of the PCB 40.

An adhesive or a tape 48 may be interposed between the main circuit board 80 and an upper portion of the shield can 45.

As an adhesive, a super view resin or an optically clear adhesive may be used.

The shield can 45 may be vertically pressed and fixed by the main circuit board 80 and the PCB 40.

In this manner, because the shield can 45 that covers at least some of the electronic components is vertically pressed and fixed by the circuit boards 40 and 80, an area of the shield can 45 may be extended to the maximum.

Figure 5:
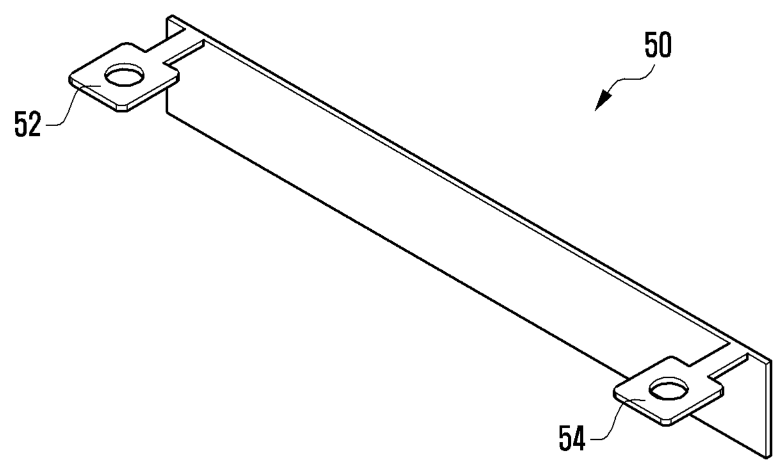
FIG. 5 is a perspective view illustrating an RF cable connection device according to various embodiments of the present invention.
Figure 6:
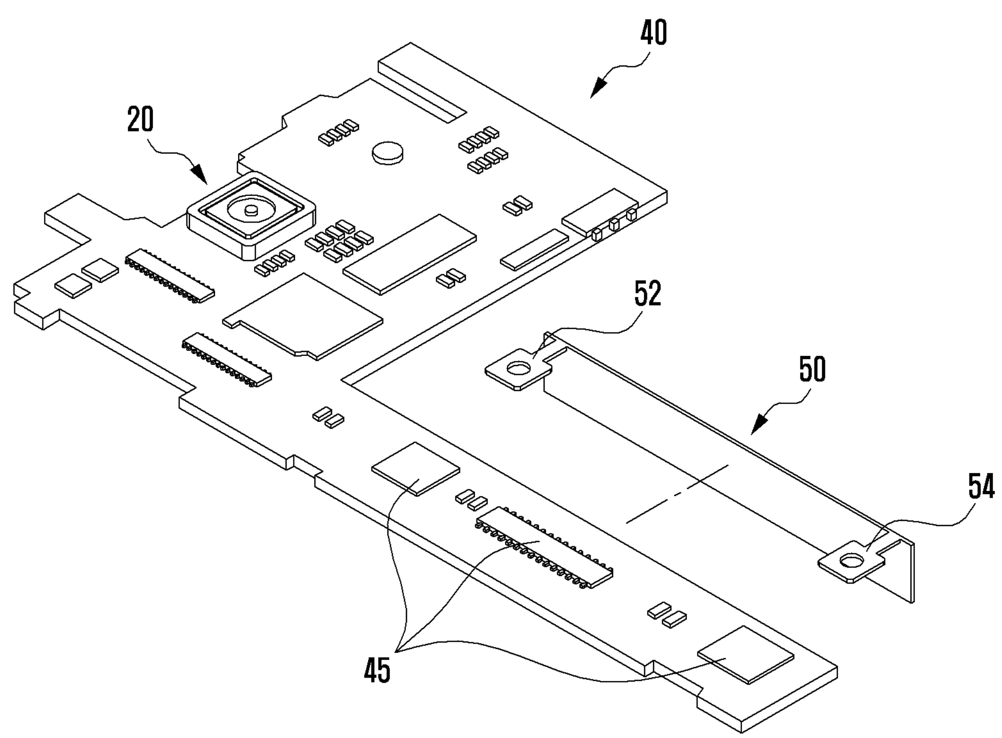
FIG. 6 is an exploded perspective view illustrating a state in which an RF cable connection device of FIG. 5 is attached to a PCB of FIG. 3.
Figure 7:
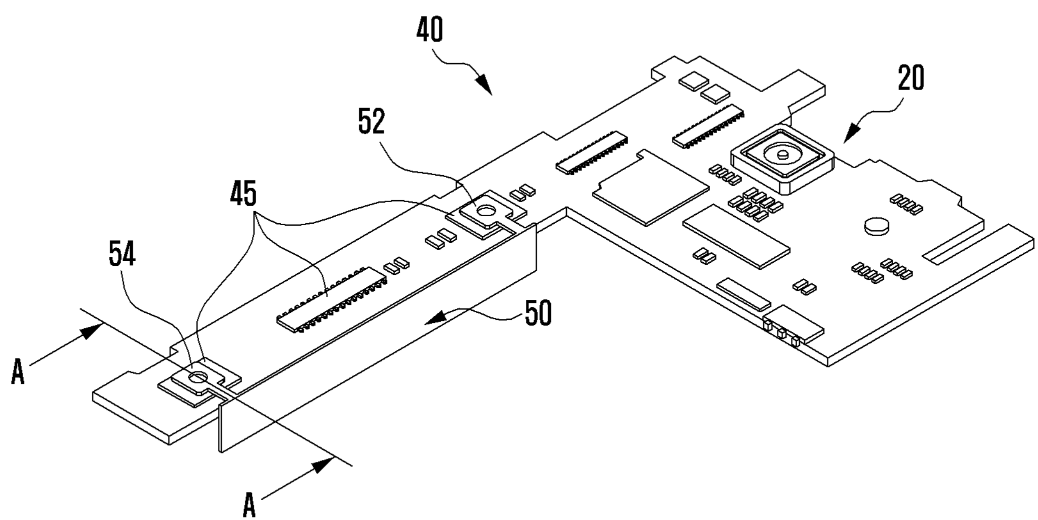
FIG. 7 is a perspective view illustrating a coupled state of FIG. 6.

FIG. 5 is a perspective view illustrating an RF cable connection device according to various embodiments of the present invention, FIG. 6 is an exploded perspective view illustrating a state in which the RF cable connection device of FIG. 5 is attached to a PCB of FIG. 3, and FIG. 7 is a perspective view illustrating a coupled state of FIG. 6.

With reference to FIGS. 5 to 7, an RF cable connection device according to various embodiments of the present invention adapts an FPCB type RF cable 50, has a structure that assemblies the FPCB type RF cable 50 in a Z-axis direction, for example, that vertically stands the FPCB type RF cable 50, and may be assembled at a side surface of the PCB 40.

The PCB 40 may include a first area of a first direction in which the lens module 20 is mounted and a second area in which electronic components for the lens module 20 are mounted in a second direction at one side of a lower portion of a first area in which the lens module 20 is mounted.

One side of the first area and one side of the second area are connected to each other to form the outer side, the other side of the first area and the other side of the second area are parallel spaced at a predetermined interval to each other to form the inner side. The FPCB type RF cable 50 may be assembled at an inner side surface of the other side of the first area.

In an embodiment, the RF cable 50 is assembled at an inner side surface of the other side of the first area of the PCB 40, but may be assembled at various locations according to a position of the RF connector. Similarly, the receptacle of the RF cable 50 to be described later may be formed at various locations according to a position of the RF connector.

Because the RF cable 50 according to various embodiments of the present invention is an FPCB of a rectangular thin plate form, in a state in which a side surface of a width direction thereof is vertically stood, at each of one end and the other end of an upper side surface, a pair of receptacles 52 and 54 may be formed.

The receptacle 52 of one end is connected to the antenna, and the receptacle 54 of the other end is connected to the RF modem; thus, a signal transmission line may be formed.

A high frequency signal transmitted through the antenna is transmitted to the signal transmission line through the receptacle 52 connected to the antenna, and the signal transmission line is connected to a module connection portion of the RF modem through the receptacle 54 connected to the RF modem; thus, a high frequency signal may be transmitted to a circuit module of the mobile terminal through the module connection portion.

Figure 8:
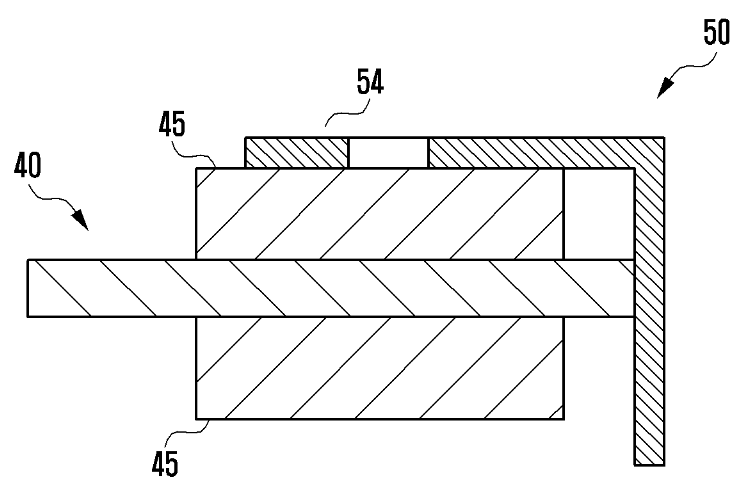
FIG. 8 is a cross-sectional view illustrating the RF cable connection device taken along line A-A of FIG. 7.

FIG. 8 is a cross-sectional view illustrating the RF cable connection device taken along line A-A of FIG. 7.

As shown in FIG. 8, in an RF cable connection device according to various embodiments of the present invention, because the FPCB type RF cable 50 is vertically stood to be assembled at an inner side surface of the PCB 40, the FPCB type RF cable 50 may have approximately the same thickness as the sum of a thickness of the PCB 40 and a thickness of the shield can 45 attached to each of upper and lower portions of the PCB 40. For example, when a thickness of the PCB 40 is 0.65t and a thickness of the shield can 45 is 1.2t, a thickness of the RF cable 50 may be approximately 3.05t.

Because a general coaxial cable occupies a considerable area in the PCB, it is ineffective, whereas in a state in which the PCB 40 has a small thickness to which the shield can 45 is vertically attached, even if the RF cable 50 is configured with an FPCB of a small thickness, by standing a FPCB in a width direction, the FPCB has a structure assembled in approximately the same height as that of a side surface of the print circuit board 40 in which electronic components of a small height are mounted; thus, an assembly space can be reduced.

Figure 9:
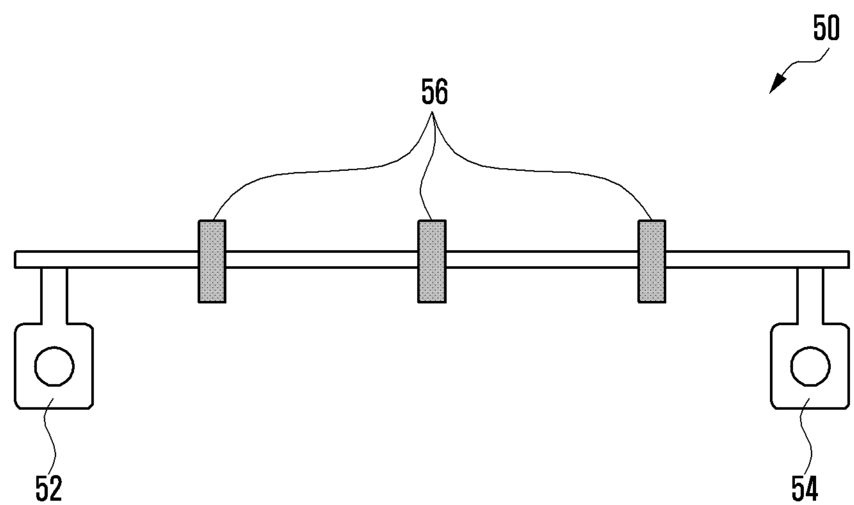
FIG. 9 is a diagram illustrating ground forming of the RF cable connection device of FIG. 5.

FIG. 9 is a diagram illustrating ground forming of the RF cable connection device of FIG. 5.

With reference to FIG. 9, the RF cable 50 of an RF cable connection device according to various embodiments of the present invention may include a plurality of conductive adhesive tapes 56 spaced at a predetermined interval for bonding to a peripheral ground.

The plurality of conductive adhesive tapes 56 are disposed at a predetermined interval in the FPCB type RF cable 50 in a serrate shape structure to be connected to a side surface of the PCB 40 or a side surface of the shield can 45; thus, the plurality of conductive adhesive tapes 56 have a structure that may be connected to the ground of a main body of a mobile terminal, whereby the ground can be easily enhanced without change of peripheral components; thus, a RF loss can be reduced.

Figure 10:
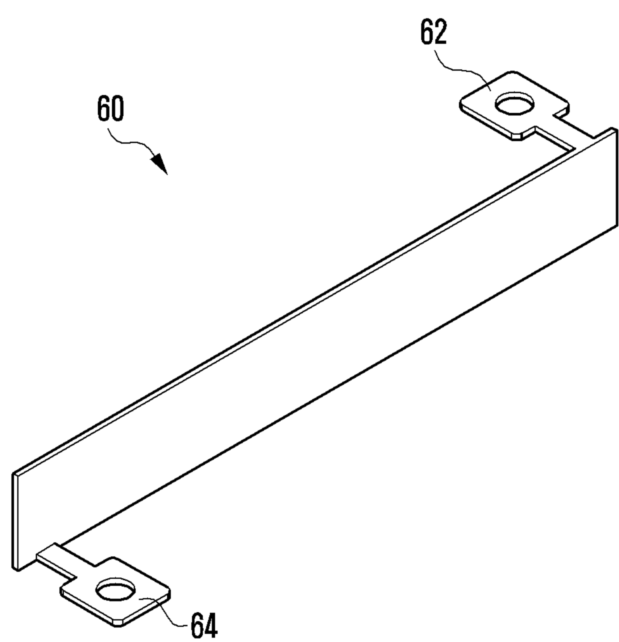
FIG. 10 is another perspective view illustrating an RF cable connection device according to various embodiments of the present invention.

FIG. 10 is another perspective view illustrating an RF cable connection device according to various embodiments of the present invention.

When an RF block and an antenna surface are located opposite to each other, an RF connector of the PCB 40 may exist at the opposite surface. In this case, in order to use a general coaxial cable, by drilling vias in the PCB 40, a wiring should be configured at the opposite surface.

In a connection device according to various embodiments of the present invention, in the FPCB type RF cable 50, because the RF block and the antenna surface are disposed at the opposite surface, even if an RF connector of the PCB 40 exists at the opposite surface, the connection device may connect the opposite surface by connection of one time.

According to an embodiment, in an FPCB type RF cable 60, in a state in which a side surface of a width direction thereof is vertically stood, at each of one end of an upper side surface and one end of a lower side surface, a pair of receptacles 62 and 64 may be formed.

Figure 11A:
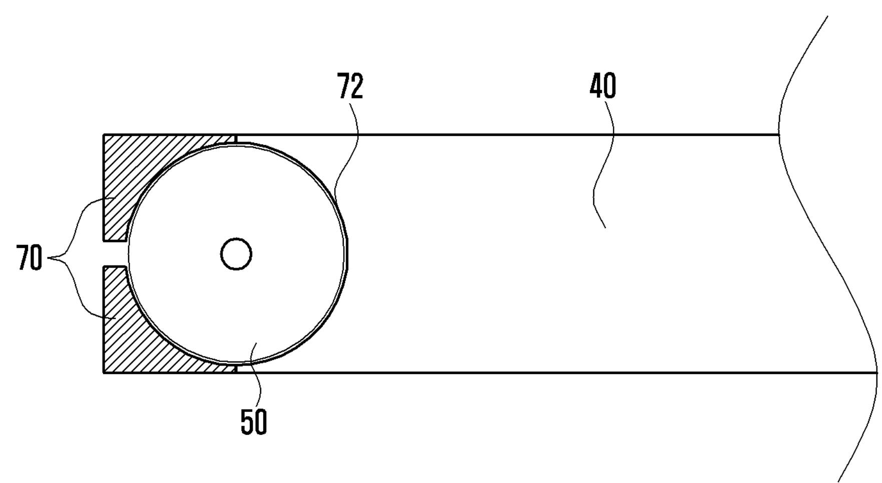
FIGS. 11A and 11B are schematic views illustrating ground application of an RF cable connection device according to various embodiments of the present invention.
Figure 11B:
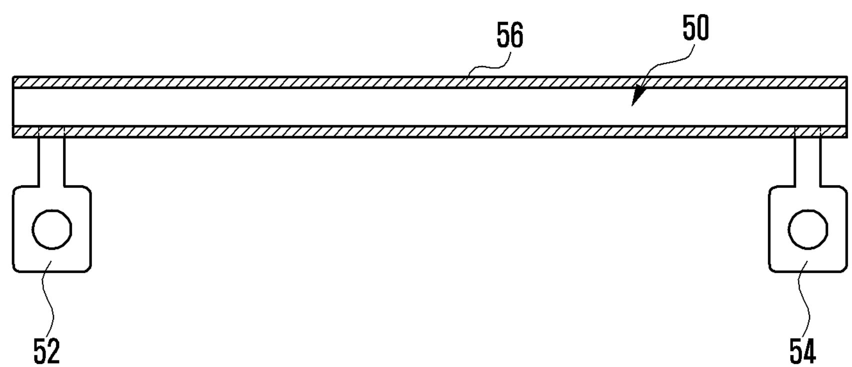

FIGS. 11A and 11B are schematic views illustrating ground application of an RF cable connection device according to various embodiments of the present invention.

When the RF cable connection device is applied to the ground, in addition to the conductive adhesive tape 56, a supporting structure may be required. According to various embodiments of the present invention, as shown in FIG. 11A, the RF cable connection device may be applied to the ground without using the conductive adhesive tape 56. According to an embodiment, a groove 72 to pass through the RF cable 50 is formed at a side surface of the PCB 40 and a support structure 70 of a clip form is attached into the groove 72, thereby implementing a support structure.

According to various embodiments of the present invention, as shown in FIG. 11B, by covering the conductive adhesive tape 56 in the RF cable 50, the ground may be implemented.

Although not illustrated in detail, an RF cable connection device according to various embodiments of the present invention may be applied to a portion that connects housings of a foldable mobile terminal.

As described above, according to various embodiments of the present invention, an electronic device includes a housing; a printed circuit board (PCB) located at the housing and including a first surface facing in a first direction, a second surface facing in a second direction opposite to the first direction, and a third surface facing in at least one direction different from that of the first and second surfaces; a first conductive contact point located at the first surface of the PCB; a second conductive contact point located at the first surface of the PCB; and at least one electrically conductive line, wherein the electrically conductive line includes a first end portion electrically connected to the first conductive contact point, a second end portion electrically connected to the second conductive contact point, and at least one insulating member configured to electrically insulate a portion of the at least one electrically conductive line, and wherein the at least one electrically conductive line and the at least one insulating member include a first portion extended to at least one side surface of the PCB.

The at least one electrically conductive line and the at least one insulating member may include a second portion bent from the first portion adjacent to the first end portion connected to the first conductive contact point.

The at least one electrically conductive line and the at least one insulating member may include a third portion bent from the first portion adjacent to the second end portion connected to the second conductive contact point.

The PCB may include a plurality of layers including at least one conductive layer, and one of the at least one electrically conductive line may be electrically connected to the at least one conductive layer through a side surface of the PCB.

The at least one electrically conductive line and the at least one insulating member may be connected together from a coaxial cable and/or a flexible PCB.

According to various embodiments of the present invention, a radio frequency (RF) cable connection device includes an RF cable using a flexible printed circuit board (FPCB) including receptacles; and a printed circuit board (PCB) to which the RF cable is vertically stood and attached.

The receptacle of one end of the RF cable may be connected to an RF modem, and the receptacle of the other end of the RF cable may be connected to an antenna.

The receptacle may be located at one surface of the PCB.

One of the receptacles may be located at one surface of the PCB, and the other one of the receptacles may be located at the other surface of the PCB.

The RF cable may include a plurality of grounds spaced at a predetermined interval for bonding to a peripheral ground.

The ground may be a conductive adhesive tape attached to the RF cable in a serrate shape and be connected to the PCB.

The conductive adhesive tape may be connected to a side surface of the PCB.

The ground may be connected to a side surface of a shield can.

According to various embodiments of the present invention, an electronic device having an RF cable connection device includes a printed circuit board (PCB) configured to mount a shield can configured to cover a radio frequency (RF) modem, an antenna, and a lens module, and at least some of electronic components for the lens module; and an RF cable stood and assembled at the PCB to connect the RF modem and the antenna.

The RF cable may include a receptacle connected to the RF modem and a receptacle connected to the antenna.

The receptacle may be located at one surface of the PCB.

One of the receptacles may be located at one surface of the PCB, and the other one of the receptacles may be located at the other surface of the PCB.

The RF cable may include a plurality of grounds spaced at a predetermined interval for bonding to a peripheral ground.

According to various embodiments of the present invention, an RF cable connection device can have a structure that can connect an upper antenna and an RF modem with a minimum area and can connect with a minimum area unlike a structure of applying in a competition company, and even when attaching to the PCB, a connection of the RF cable connection device can be complete, i.e., the RF cable connection device can be applied directly in a manufacturing part without assembly of a main outer circumference line; thus, assembly can be quickly and cheaply performed, and an application in a switching antenna task can be variously considered.

Exemplary embodiments disclosed in this specification and drawings are suggested as a specific example to easily describe the present invention and to help understanding thereof and do not limit the scope of the present invention. Therefore, it should be understood that changes and variations obtained based on the spirit and scope of the present invention in addition to exemplary embodiments disclosed herein are included in the scope of the present invention.

We claim:

1. A radio frequency (RF) cable connection device of an electronic device, comprising:

a flexible printed circuit board (FPCB) type RF cable being vertically connected to a printed circuit board (PCB) of the electronic device;

a first receptacle formed on the FPCB type RF cable, the first receptacle being configured to extend outward from the FPCB type cable in a perpendicular direction to a planar surface of the FPCB type cable and to be connected to an antenna on the PCB of the electronic device; and a second receptacle formed on the FPCB type RF cable, the second receptacle being configured to extend outward from the FPCB type cable in a perpendicular direction to the planar surface of the FPCB type cable and to be connected to an RF modem on the PCB of the electronic device, wherein a radio signal from the RF modem is transmitted to the antenna through an electrical path between the first receptacle and second receptacle.

2. The RF cable connection device of claim 1, wherein the FPCB type RF cable comprises a plurality of conductors being spaced apart at a predetermined interval for connecting to a peripheral ground on the PCB of the electronic device.

3. The RF cable connection device of claim 1, wherein the FPCB type RF cable comprises a plurality of conductive adhesive tapes having a serrate shape, each of the conductive adhesive tapes being spaced apart at a predetermined interval for connecting to a peripheral ground on the PCB of the electronic device.

4. The RF cable connection device of claim 3, wherein the conductive adhesive tapes are connected to a side surface of the PCB of the electronic device.

5. The RF cable connection device of claim 2, wherein at least one of the conductors is connected to a side surface of a shield can disposed on the PCB of the electronic device.

* * * * *